United States Patent [19]

Dean et al.

[11] Patent Number: 4,501,183
[45] Date of Patent: Feb. 26, 1985

[54] LEADLESS CHIP PLACEMENT MACHINE FOR PRINTED CIRCUIT BOARDS

[75] Inventors: Weibley J. Dean, Binghamton; Charles E. Johnson, Whitney Point; Phillip A. Ragard, Binghamton, all of N.Y.

[73] Assignee: Universal Instruments Corporation, Binghamton, N.Y.

[21] Appl. No.: 603,906

[22] Filed: Apr. 25, 1984

Related U.S. Application Data

[62] Division of Ser. No. 260,990, May 6, 1981, Pat. No. 4,458,412.

[51] Int. Cl.³ .............................................. B26D 5/26
[52] U.S. Cl. ...................................... 83/233; 83/278; 83/423; 226/62; 226/68
[58] Field of Search ............... 83/233, 232, 278, 423; 226/62, 64, 65, 68, 67

[56] References Cited

U.S. PATENT DOCUMENTS

| | | | |
|---|---|---|---|
| 2,746,543 | 5/1956 | Gezich | 83/233 |
| 2,768,826 | 10/1956 | Gaite | 226/62 |
| 4,017,167 | 4/1977 | Mitchell | 226/62 X |
| 4,203,335 | 5/1980 | Coffey | 83/232 |

Primary Examiner—Frank T. Yost
Attorney, Agent, or Firm—Fidelman, Wolffe & Waldron

[57] ABSTRACT

A feed assembly is engageable with feed holes spaced along the length of a taped supply of electrical components in order to index the taped components to a pick-up station and aid in transfer of the components from the tape to a turret-type vacuum head at the pick-up station. Cyclical actuation of the feed assembly actuates a cutter for that portion of the tape which has been emptied of the components.

2 Claims, 37 Drawing Figures

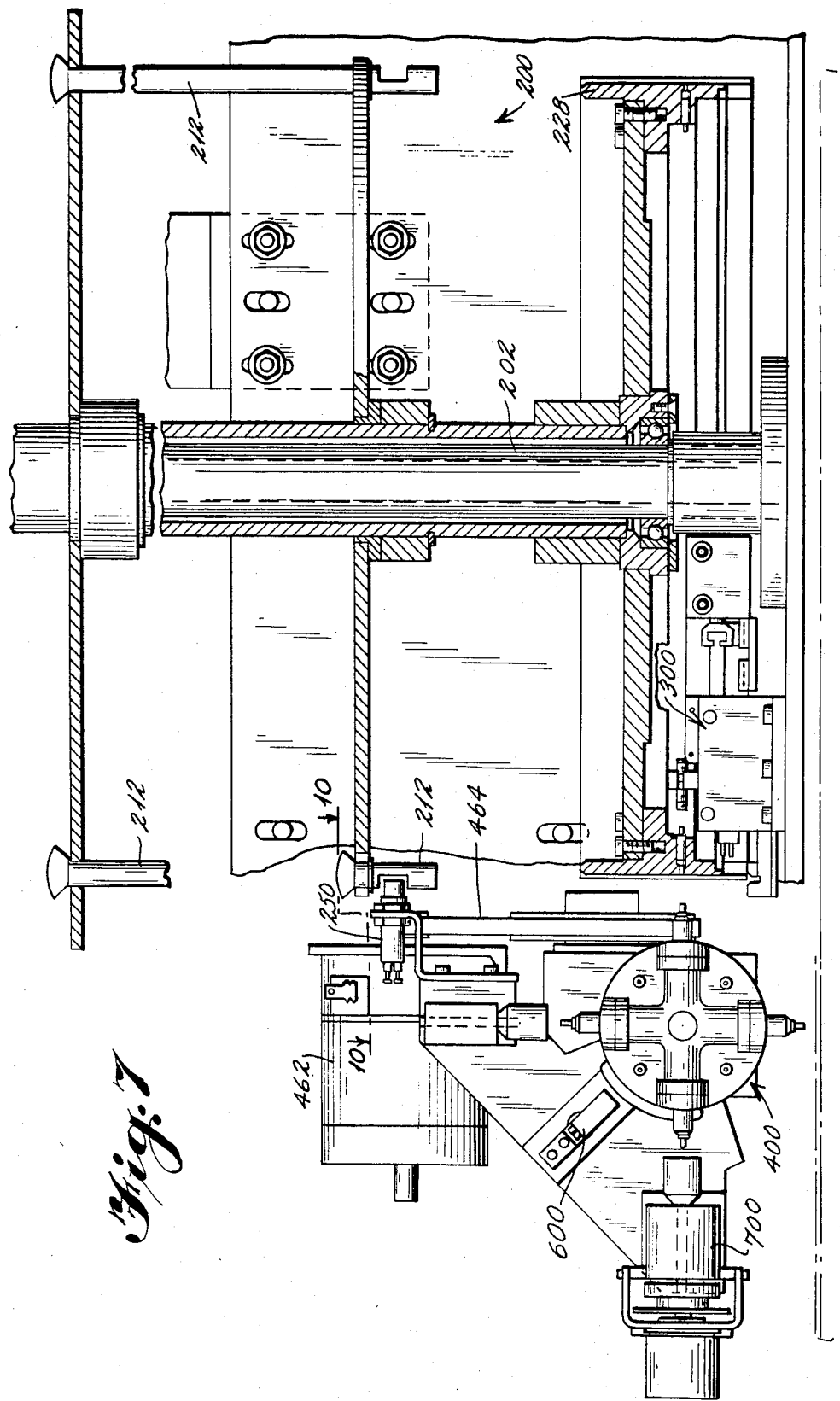

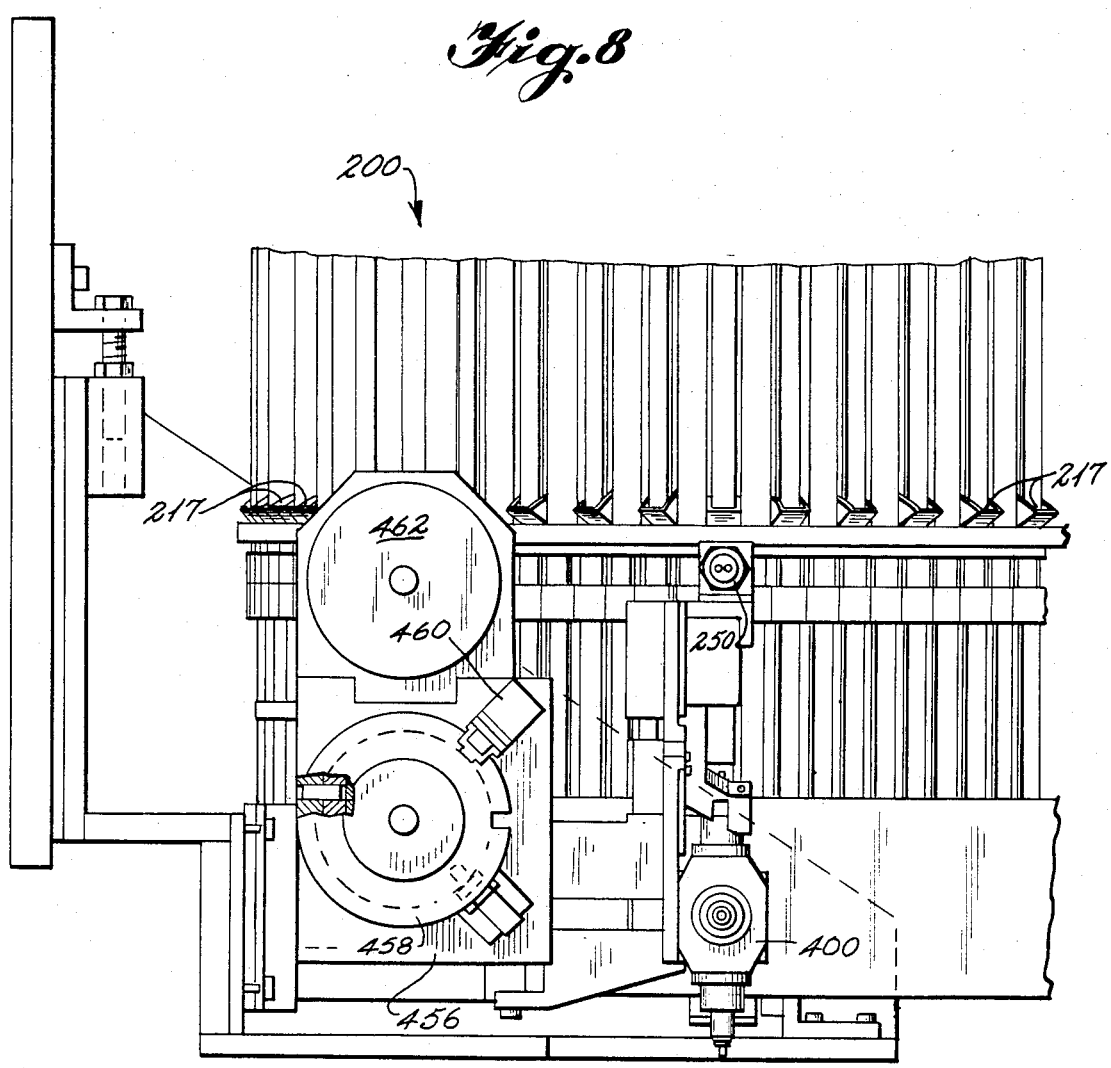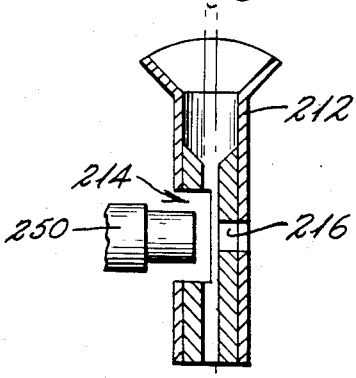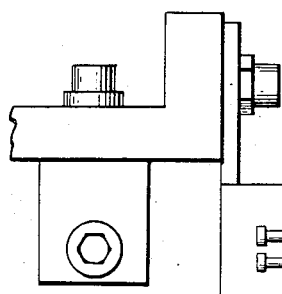

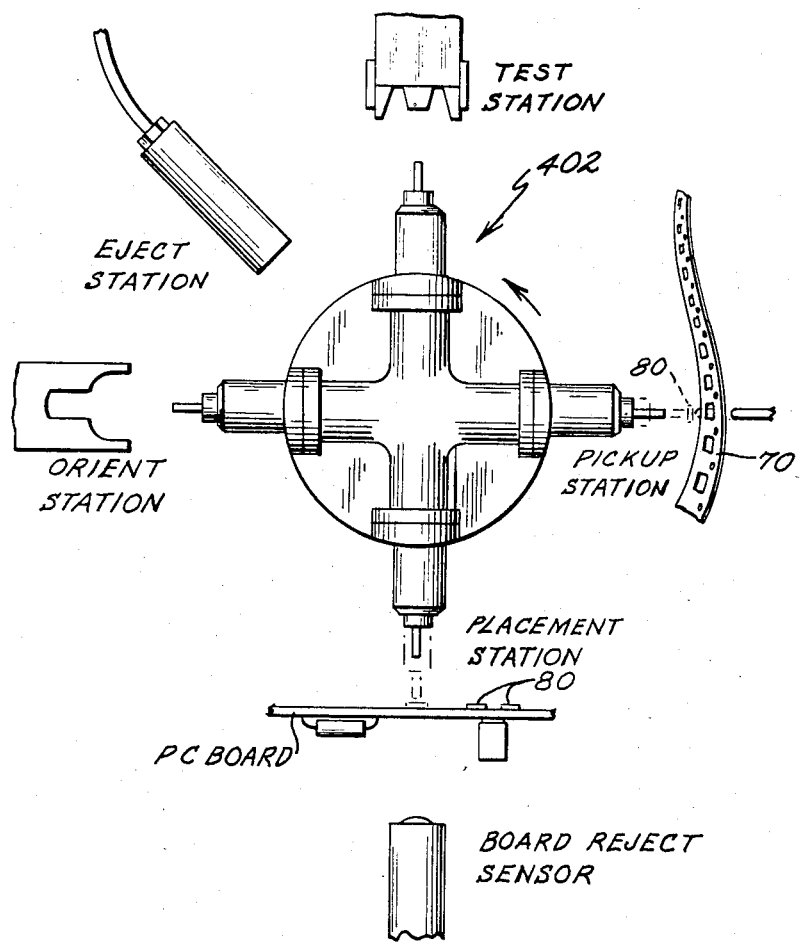

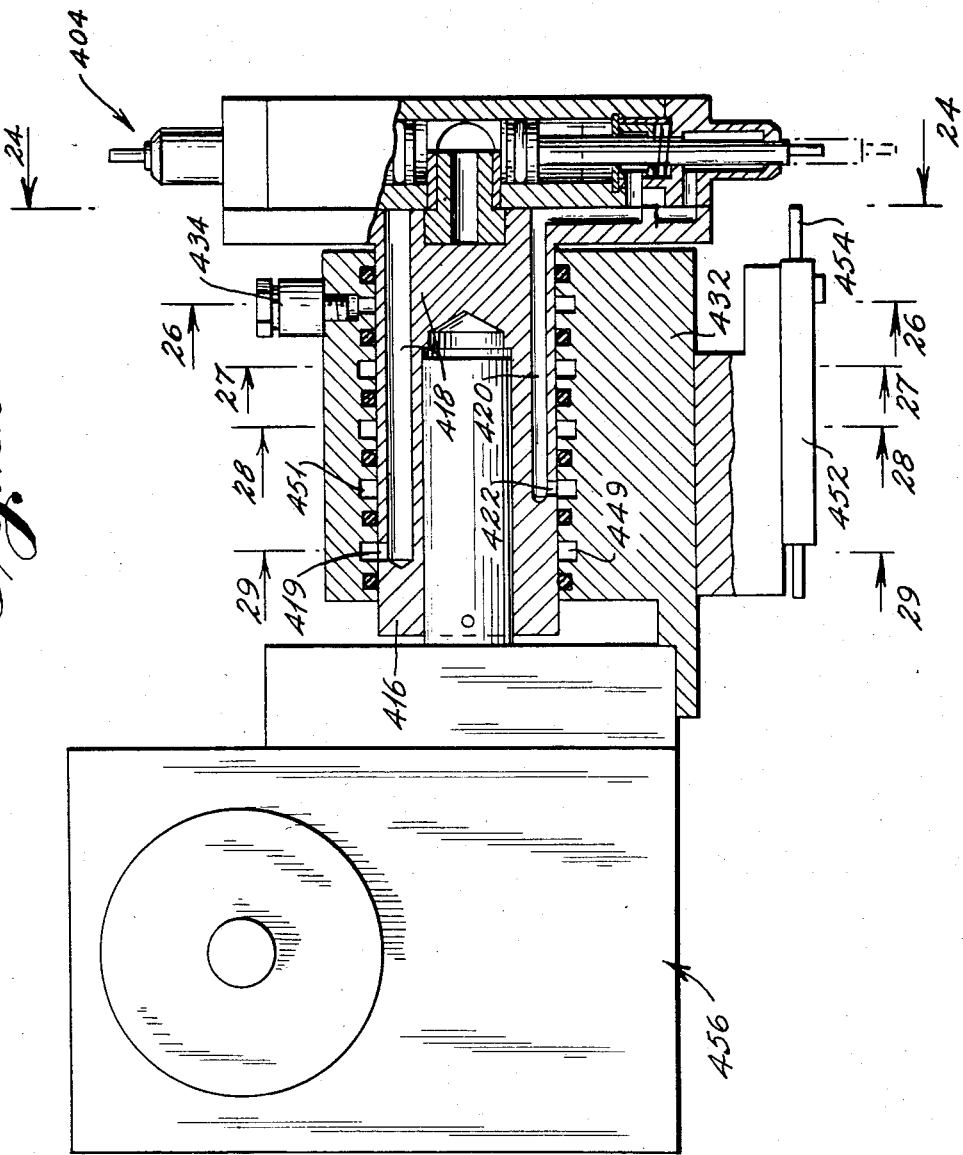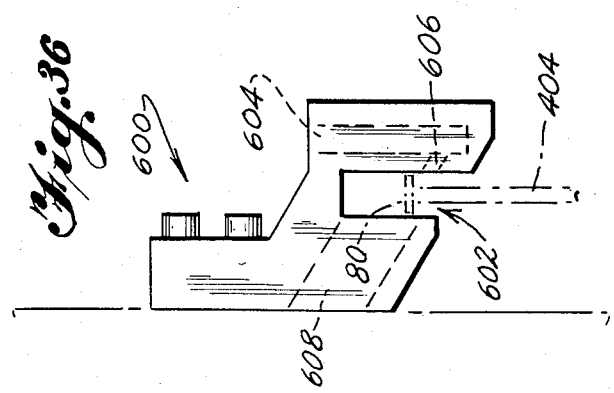

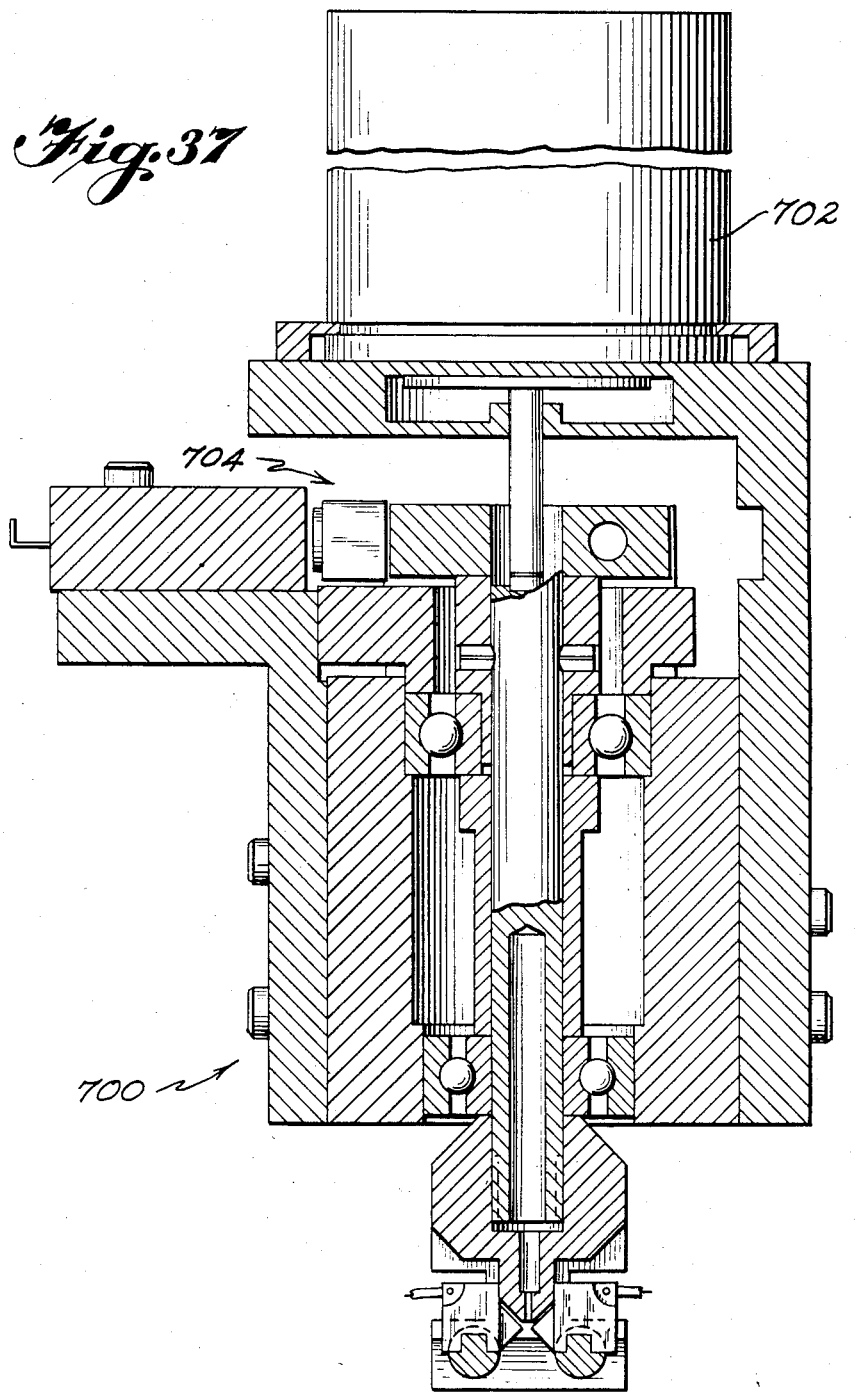

LEADLESS CHIP PLACEMENT MACHINE FOR PRINTED CIRCUIT BOARDS

This is a divisional of application Ser. No. 260,990, filed May 6, 1981 issued as U.S. Pat. No. 4,458,412 on July 10, 1984.

BACKGROUND OF THE INVENTION

This invention is directed to a machine for supplying and placing leadless electronic components at selected positions on a printed circuit (P.C.) board. In particular, dots of glue are applied to automatically positioned P.C. boards and then leadless components (chips) are placed on the dots of glue, as programmed into a computer.

Heretofore, no one machine has been developed to provide the high speed, accurate securement of leadless components to P.C. boards as in the instant invention.

It is an object of this invention to provide an automatic positioning system for P.C. boards and the associated high speed equipment to supply components from selected supply reels to a rotating turret-type head by which the components are transported through testing, ejecting, and orienting stations prior to placement onto the P.C. boards.

This and other objects of the invention are realized and will become evident in reading the detailed description of the invention.

BRIEF SUMMARY OF THE INVENTION

Described is a machine for pre-gluing raw circuit surfaces of printed circuit boards (P.C. boards) at an adhesive station and properly positioning the P.C. boards at a placement station for placement of leadless electronic components (chips) onto the adhesive. A carousel provides random vertical supply of taped components to a feeder assembly which feeds individual chips onto a nozzle of a turret-type vacuum head at a pick-up station. The turret-type head has four nozzles spaced 90° apart about the central axis of the head. As the turret is rotated, a chip is transported by a nozzle sequentially from the pick-up station to a centering and testing station, a centering and orienting station, and a placement station. Located between the testing and orienting stations is a chip removal station for ejecting defective or inverted chips. Sensors are located at the adhesive and placement stations to detect defective P.C. boards so that they may be bypassed. A controller, such as a digital computer, provides additional monitoring and controls the operation of the machine.

BRIEF DESCRIPTION OF THE DRAWINGS

FIG. 7 is a front elevation, partially in section, illustrating the relative positions of the Turret Assembly, Magazine Supply Assembly, and Feed Assembly.

FIG. 8 is a left side partial elevation, illustrating the positional arrangement of the carousel and turret assemblies.

FIG. 9 is a sectional elevation, taken along arrows 9—9 of FIG. 10.

FIG. 10 is a sectional view, taken along arrows 10—10 of FIG. 8.

FIG. 21 illustrates the positions of the various stations of operation about the turret head.

FIG. 22 is a partial section elevation of FIG. 30.

FIG. 36 is an enlarged side elevation of the ejector.

FIG. 37 is a side elevation, partially in section, of the orienter.

DETAILED DESCRIPTION OF THE INVENTION

Figure 1:
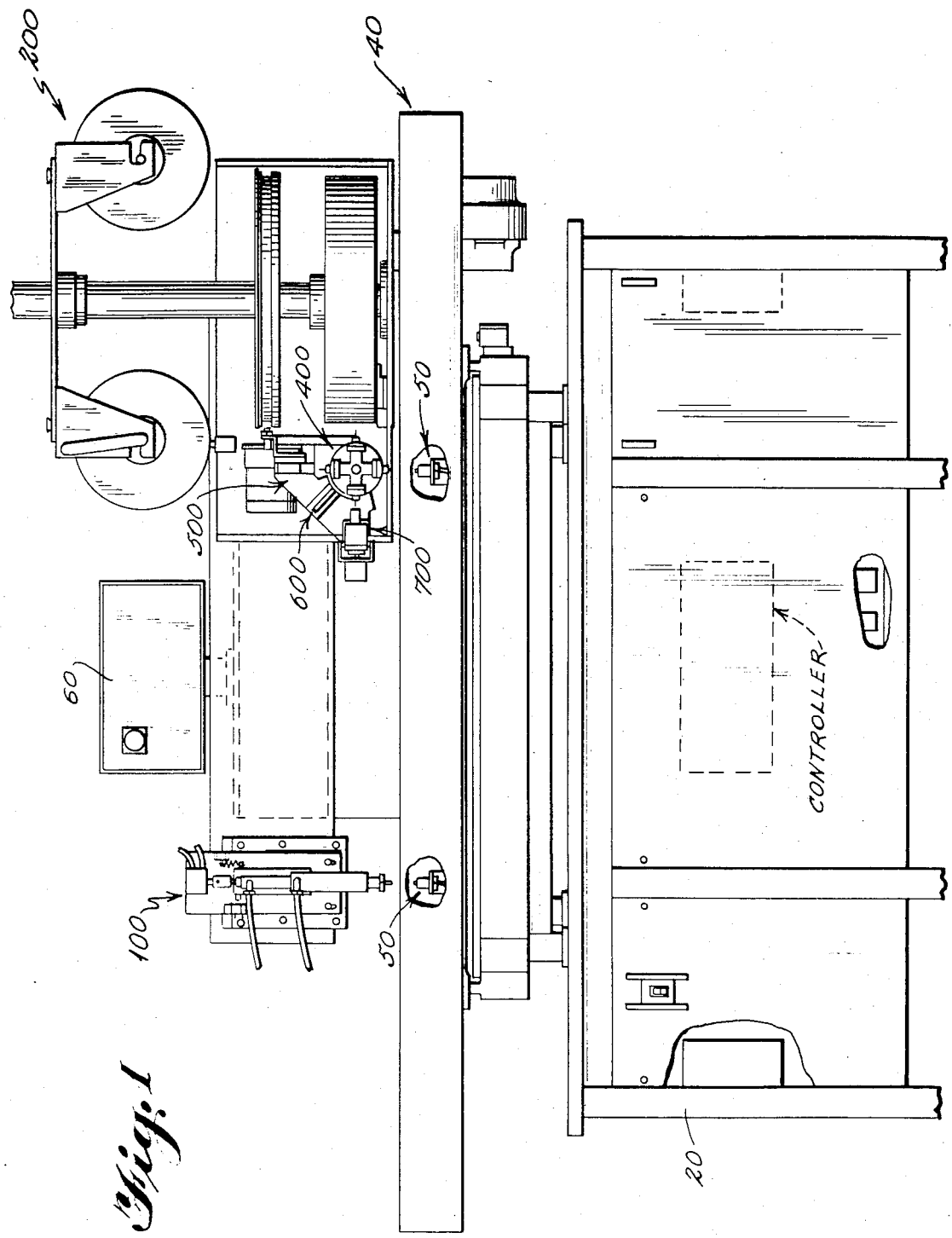
FIG. 1 is a front elevation of the overall machine.
Figure 2:
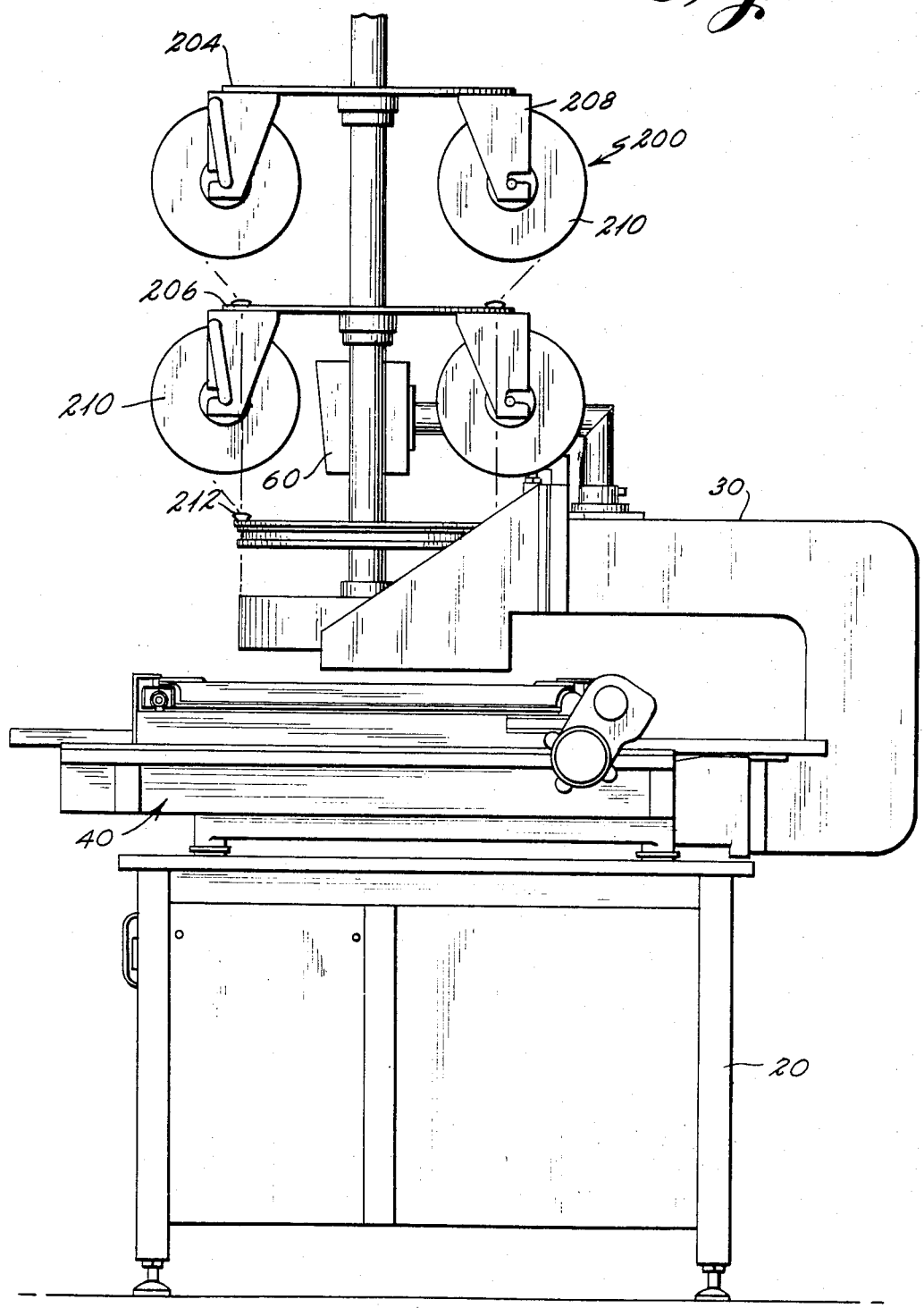
FIG. 2 is a right side elevation of the machine of FIG. 1.
Figure 13:
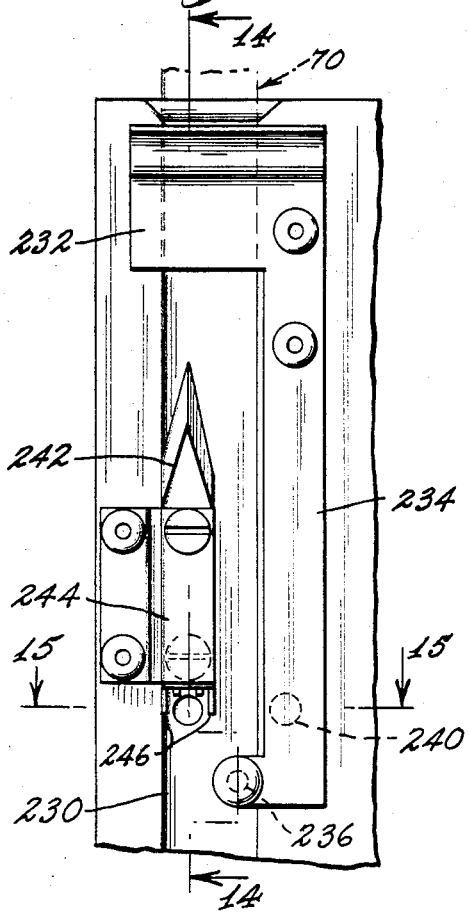
FIG. 13 is an enlarged elevation of a portion of the registration segment of FIG. 11.
Figure 14:
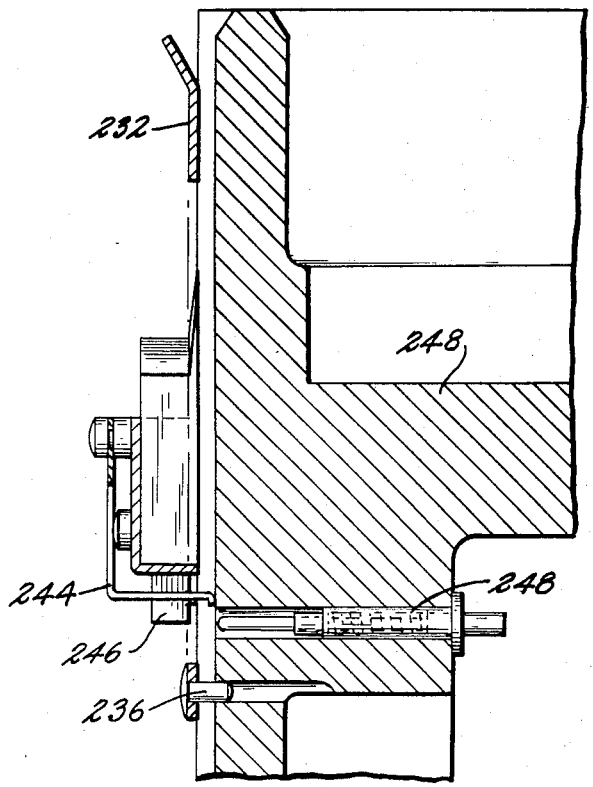
FIG. 14 is a sectional view along arrows 14—14 of FIG. 13.
Figure 15:
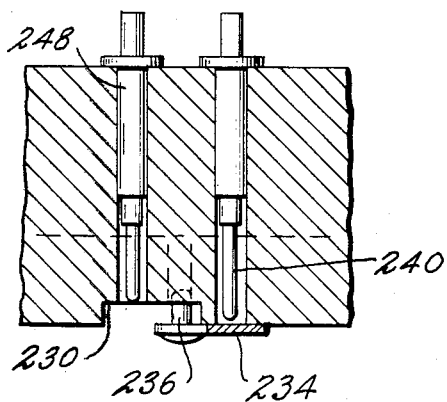
FIG. 15 is a sectional view along arrows 15—15 of FIG. 13.

In FIGS. 1 and 2, relative positions of portions of the machine may be seen, as follows: base 20, C-frame 30, X-Y Positioning Assembly 40, Adhesive Head Assembly 100, Carousel Magazine Assembly 200, and Turret Head Assembly 400. These and other portions of the machine are described below, in detail, prior to a general description of the overall operation of the machine.

Figure 3:
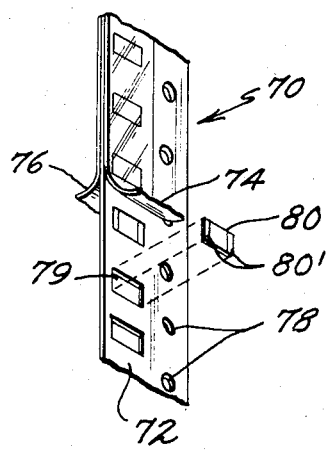
FIG. 3 is a partially exploded isometric view of the component supply tape.

FIG. 3 discloses the tape 70 in which leadless components (chips) 80 are normally supplied. A substrate 72 of laminated cardboard is provided with apertures 79 along the length thereof. To retain the components 80 in apertures 79, rear transparent film 76 and front transparent film 74 are attached, as by glue (sometimes, the rear transparent film is replaced by a thin paper layer). Feed holes 78 are provided along the length of tape 70 for feeding of the tape. The chips 80 are leadless passive and active circuit components such as capacitors, resistors, inductors, semiconductors and the like. An example such as chip 80 is the monolithic ceramic capacitor manufactured by Murata Corporation of America.

X-Y POSITIONING ASSEMBLY 40

For proper positioning of P.C. boards, prior to adhesive dot application and placement of the chips onto the adhesive dots, a dual X-Y positioning assembly 40 is driven by high torque, low inertia servo motors (not indicated on drawings) and provides nominal positioning values as follows: 900" per minute positioning speed; ±0.002" positioning accuracy; and ±0.001" positioning repeatability.

ADHESIVE HEAD ASSEMBLY 100

As viewed in FIG. 1, the Adhesive Head Assembly 100 is located on the left side of the machine. A small dot of adhesive is applied to each selected position of a P.C. board to which a chip is to be secured. Each dot is positioned so that a small portion of adhesive will protrude from under an applied chip, thus assuring proper adhesive curing by ultraviolet light. After the adhesive dots are applied to selected positions on a P.C. board, it is transferred and another P.C. board is positioned under the Adhesive Head Assembly 100.

Figure 4:
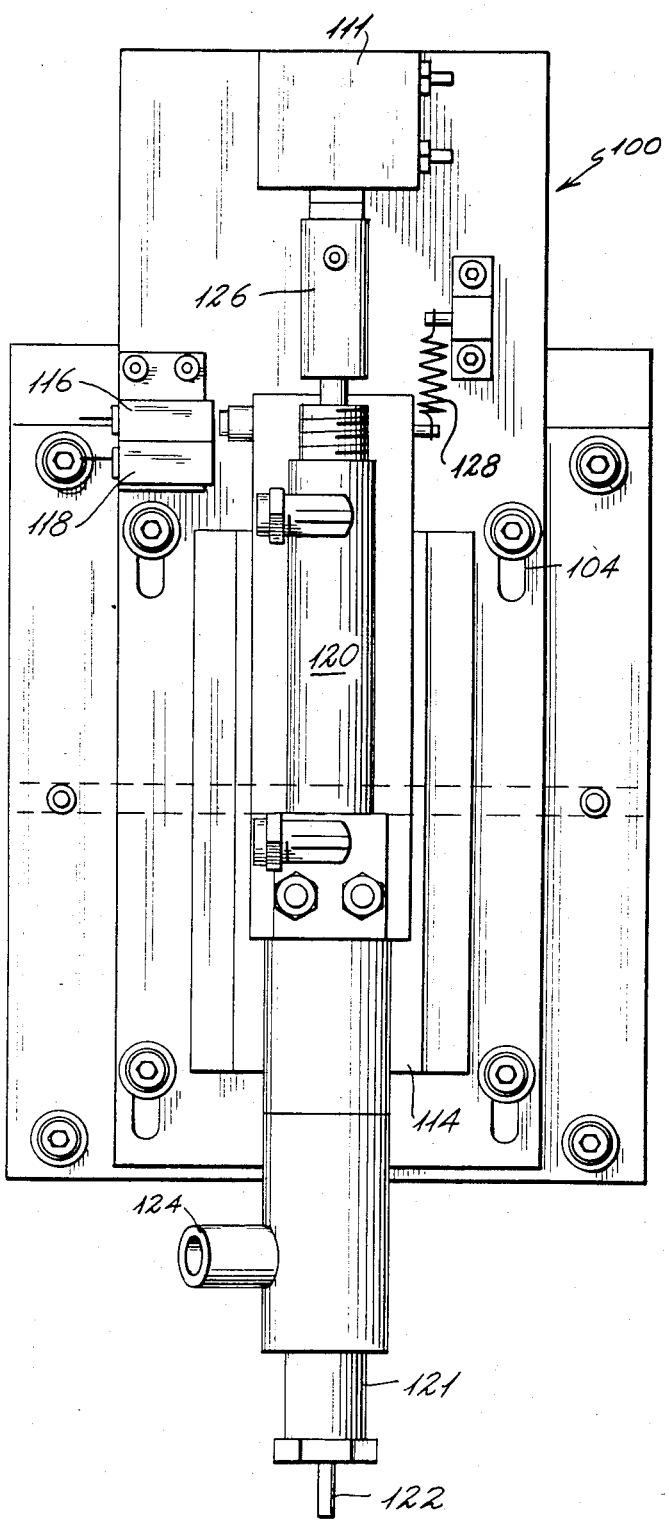
FIG. 4 is a front elevation of the Adhesive Applicator Assembly.
Figure 5:
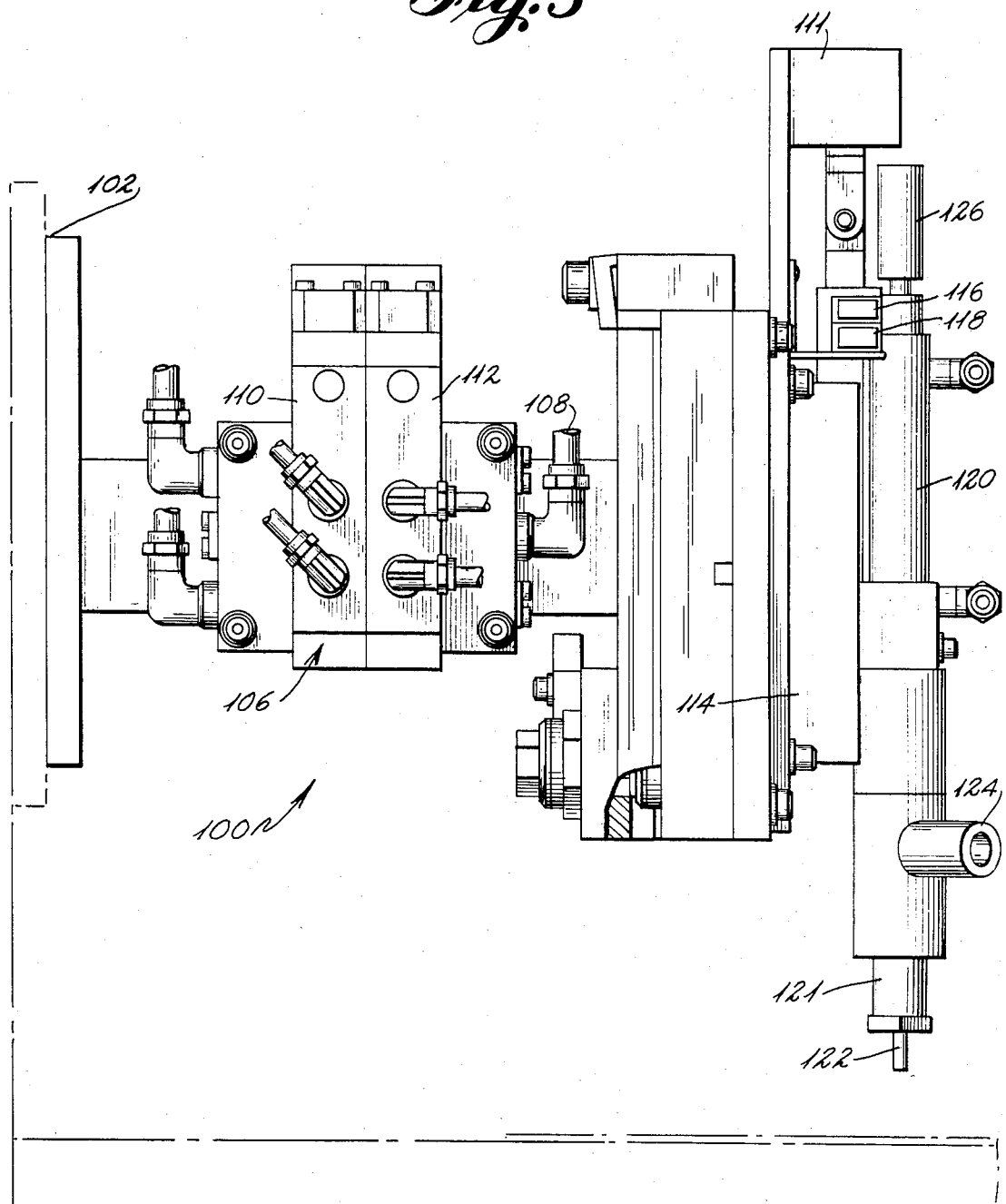
FIG. 5 is a left side elevation of FIG. 4.

Referring to FIGS. 4 and 5, the Adhesive Head Assembly 100 is a modified version of the Marco-II Dispensing System, Model #998000, supplied by Loctite Corporation. The modified dispenser is mounted vertically on support 102, which also supports a valve arrangement 106, and is vertically adjustable at 104. Air is supplied to valve arrangement 106 at 108, with valve 110 furnishing air to both sides of piston/cylinder 111 and valve 112 furnishing air to the unmodified pump cylinder 120 in the conventional manner. Pump cylinder 120 is moved vertically in slide 114 by cylinder/piston 111 during the stroking thereof (nominally, a ½" stroke), with Hall effect switches 116, 118 sensing the limits of stroking. Modifications were made to pump chamber 121 and needle-type nozzle 122 to provide straight-through supply of adhesive, the inlet 124 for which is connected to a non-lubricated air pressurized reservoir (not shown). The amount of adhesive deposited onto the P.C. board is controlled by adjustment knob 126. Tension spring 128 is provided to return the dispensing head upwardly when no air is supplied to piston/cylinder 111.

MAGAZINE ASSEMBLY 200

Figure 12:
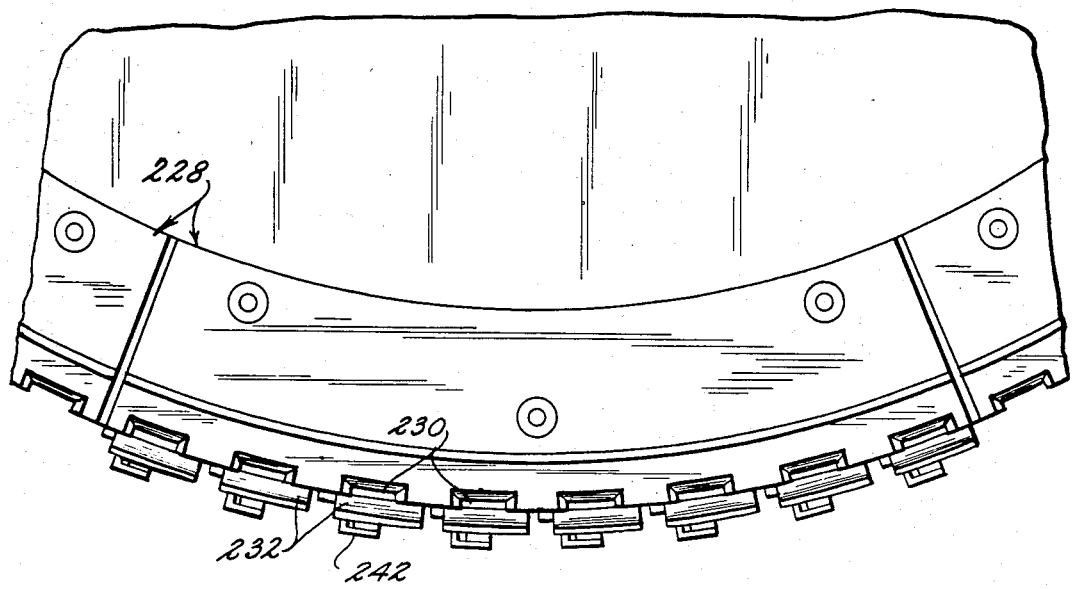
FIG. 12 is a partial plan view of apparatus of FIG. 11.
Figure 11:
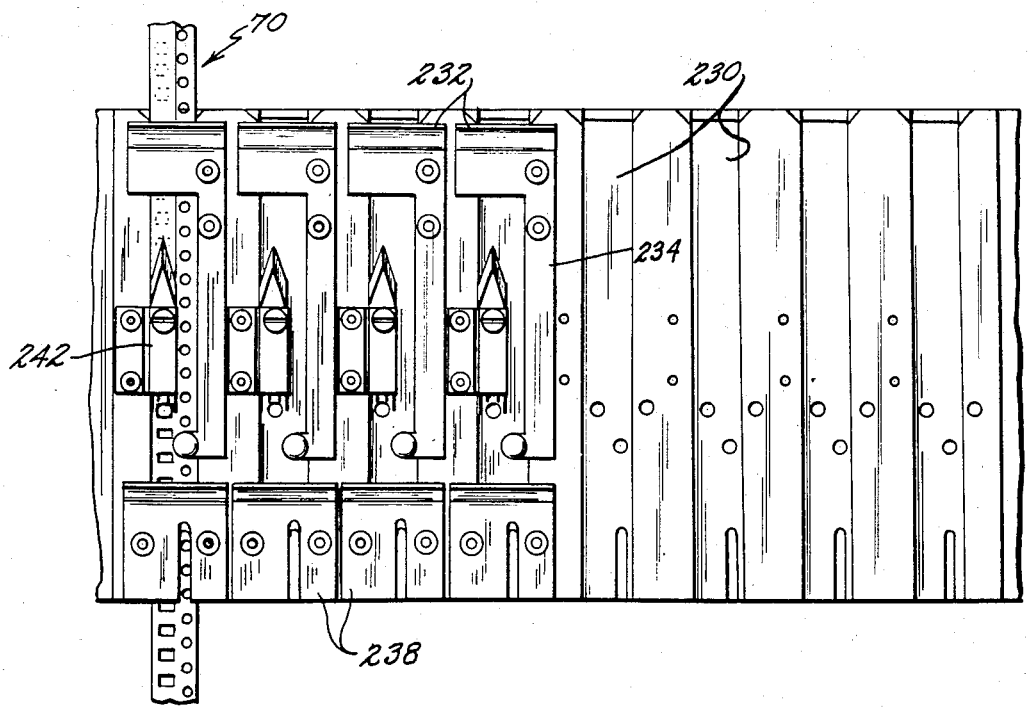
FIG. 11 is a front elevation of a registration segment.

Referring to FIGS. 2 and 6-15, the magazine assembly 200 is in the form of a two-tiered carousel mounted for rotation on support hub 202. Each tier 204, 206 has plural reel support brackets 208 mounted thereon for rotatably holding reels 210 of component supply tapes 70. Each tier 204, 206 has transparent plastic guide tubes 212 associated therewith for the tapes that are fed from respective reels 210, with the guide tubes for the lower tier 206 necessarily being shorter than those for the upper tier 204. The guide tubes 212 are provided to protect the cardboard substrate 72 (FIG. 3) of supply tapes 70 from delamination caused by excess bending or twisting thereof, with the transparency of tubes 212 allowing an operator to view the tapes 70 therein for any supply problems. As seen in FIGS. 9 and 10, guide tubes 212 are cut away at 214 to prevent interference with an end-of-tape sensor 250 during rotation of the carousel. End-of-tape sensor 250 may be a Festo Pneumatic micro-proximity sensor, type RML-5. Alternatively, a reflecting light sensor could be used. Orifice 216 is provided in guide tube 212 so that no back pressure will be developed at sensor 250 after the end of tape 70 has been fed past orifice 216. The carousel magazine assembly 200 is also provided with tape registration segments 228 about the lower periphery thereof as seen in FIGS. 11 and 12. By providing a segmented registration means, various segments 228 are removable to allow easy servicing access to feeder assembly 300 (FIG. 7). These removable segments 228 may be interchangeable with similar segments, according to differing dimensions of tape 70.

Figure 6:
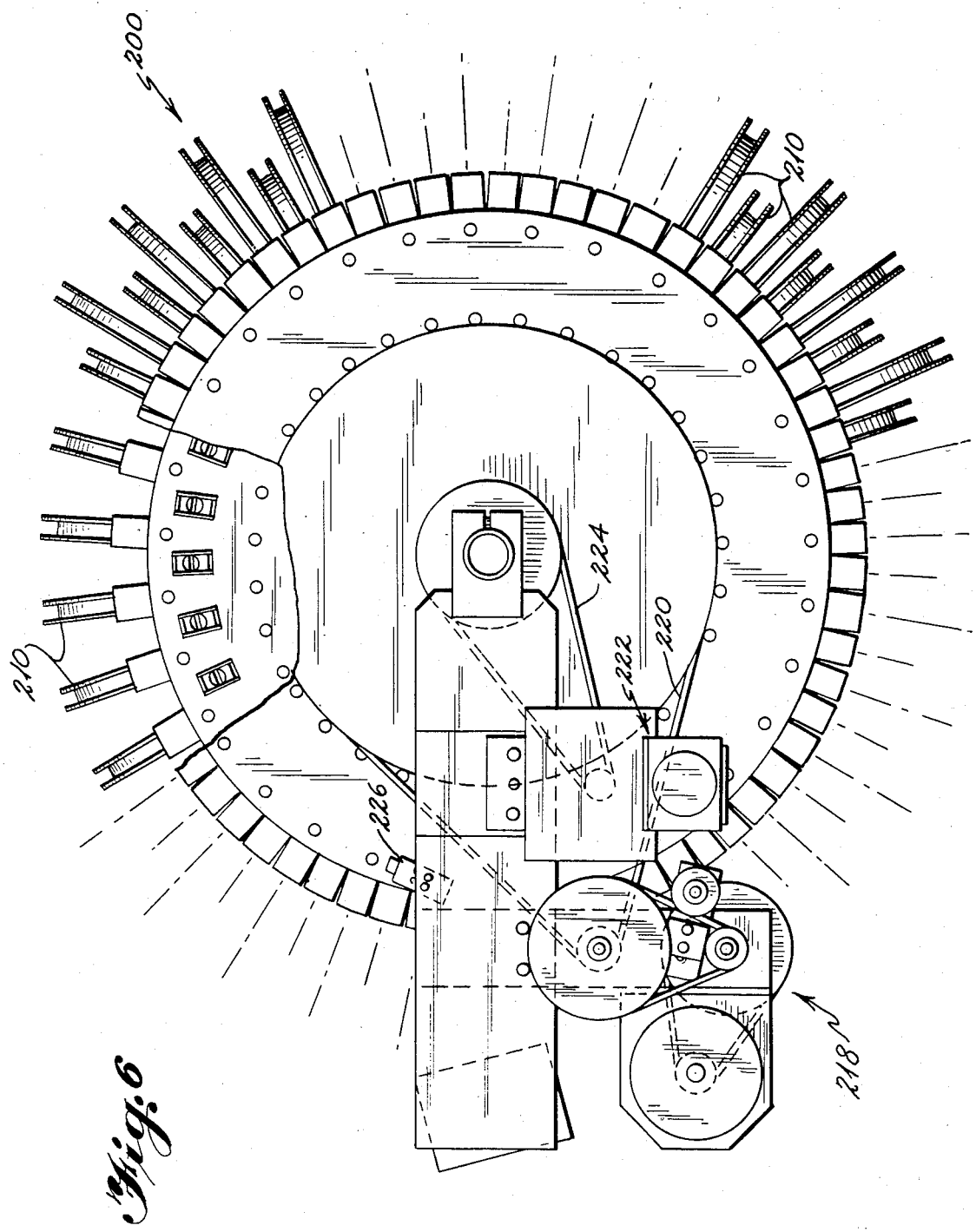
FIG. 6 is a top plan view of the component supply carousel and drive assembly.

As seen in FIG. 6, rotational drive of the carousel 200 is provided by a motor and speed reduction assembly 218 through a timing belt 220, with another timing belt 224 providing positive feedback to encoder 220 from the carousel. Hall effect switch 226 and an associated carousel mounted magnet senses "home" position of the carousel prior to start-up.

Figure 16:
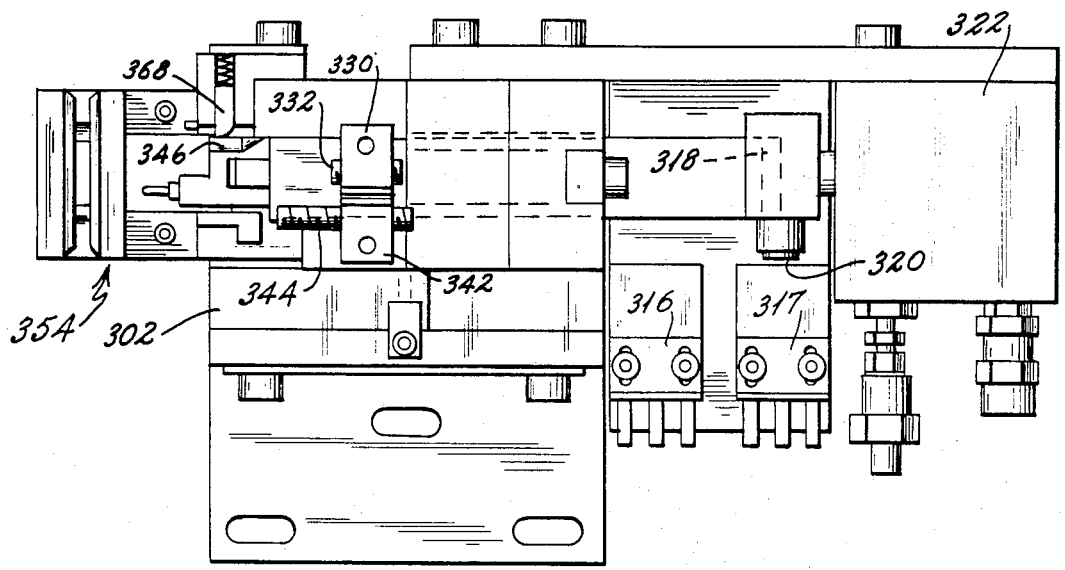
FIG. 16 is a plan view of the feeder assembly.

Each registration segment 228 handles several (nominally eight) supply tapes 70. For each tape 70 there is a guide groove 230, registration (lock) pin 236, and plow knife 242, as seen in FIGS. 11-15. Tape 70 is held in guide groove 230 at the top by retainer 232 and at the bottom by retainer 238. Retainer 232 also includes spring metal finger 234 on which lock pin 236 is mounted. Lock pin 236 engages a tape feed hole 78 (FIG. 3) for proper vertical positioning of tape 70 at the pick-up station. Located behind finger 234 (as viewed in FIGS. 13 and 15) is a release pin 240 which is normally biased away from finger 234 (toward the inside of the carousel), but which is extended by a set screw 344 of feed assembly 300 (FIG. 16) to disengage lock pin 236 from a tape feed hole 78 when the supply tape 70 is to be advanced. During advance of supply tape 70, plow knife 242 splits front film 74 longitudinally to open one side of the apertures 79. The body of plow knife 242 acts as the front cover for the opened aperture 79 until just prior to the component 80 reaching the pick-up position. During tape advancement, a spring metal arm 244 of plow knife 242 pushes the component 80 against the back film 76 of aperture 79 and it is believed that surface tension and static electricity help keep the chip 80 against back film 76 for pick-up. To assist in keeping the split front film separated at the point of pick-up, arms 246 are provided on plow knife 242 through which a vacuum pick-up nozzle 404 is reciprocated. Behind the point of pick-up is a knockout pin 248, spring biased like lock pin 236, which is extended when set screw 332 (FIG. 16) of feeder assembly 300 engages the rear of it. Knockout pin 248, when extended, slightly deforms the rear film 76 to push chip 80 toward nozzle 404 during pick-up.

FEED ASSEMBLY 300

By referring to FIG. 7, the reader will see the positioning of Feed Assembly 300 relative to the rest of the machine. Feed Assembly 300 (FIGS. 7, 16-20) comprises a housing 302 within which a cam bar 304 and lever support block 324 are slidable during the forward and reverse strokes of a piston/cylinder 322. Cam bar 304 is attached to the piston of piston/cylinder 322 by a clevis arrangement 318 for reciprocation with the piston during stroking. A magnet 320 also is supported by clevis 318 so that the forward and reverse limits of stroking are sensed by Hall effect switches 316, 317. A detent 306 keys lever support block 324 to cam bar 304 during a portion of the forward stroke until stop rod 350 of housing 302 is engaged by the rear limit of channel 352. Detent 306 is vertically reciprocatable in cam bar 304 so that angled surface 308 of detent rides up cam surface 310 of housing 302 during the forward stroke to unkey detent 306 of cam bar 304 from notch 306' of lever support block 324 and cam bar 304 When lever support block 324 is halted by stop rod 350, the unkeyed cam rod 304 continues forward. For adjustment purposes, cam surface 310 is part of a separable piece 312 which is adjustable forward and backward on housing 302 by screw 314. Lever 326 is pivotally supported on block 324 at 328 and is biased upwardly by compression spring 348 into engagement with the bottom of cam bar 304. A roll 334 is mounted on lever 326 by an eccentric 336 for adjustment of the pivotal arc length of lever 326. For a reason yet to be explained, a spring biased dog 368 (FIG. 16) is mounted on housing 302 and adapted to engage the top of lever 326 after this counterclockwise pivoting.

Figure 17:
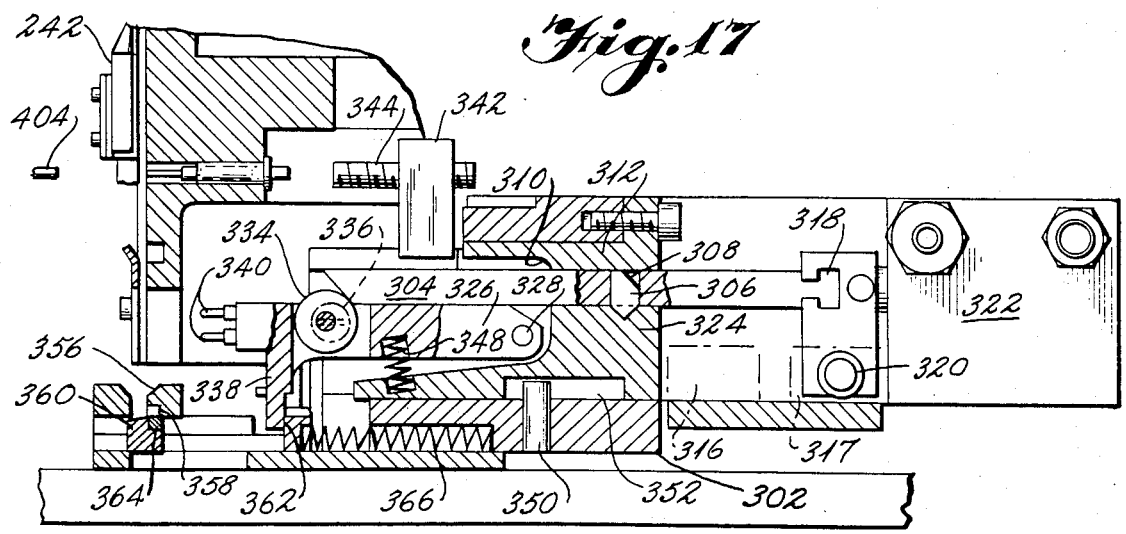
FIGS. 17-19 are side elevations, partially in section, of the feeder of FIG. 16, depicting various positions of the feeder parts.
Figure 18:
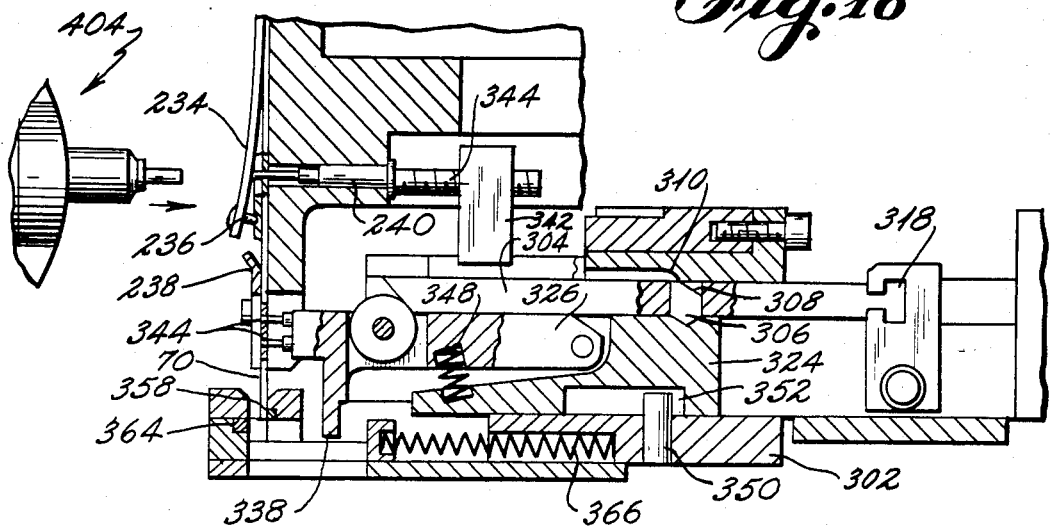
Figure 19:
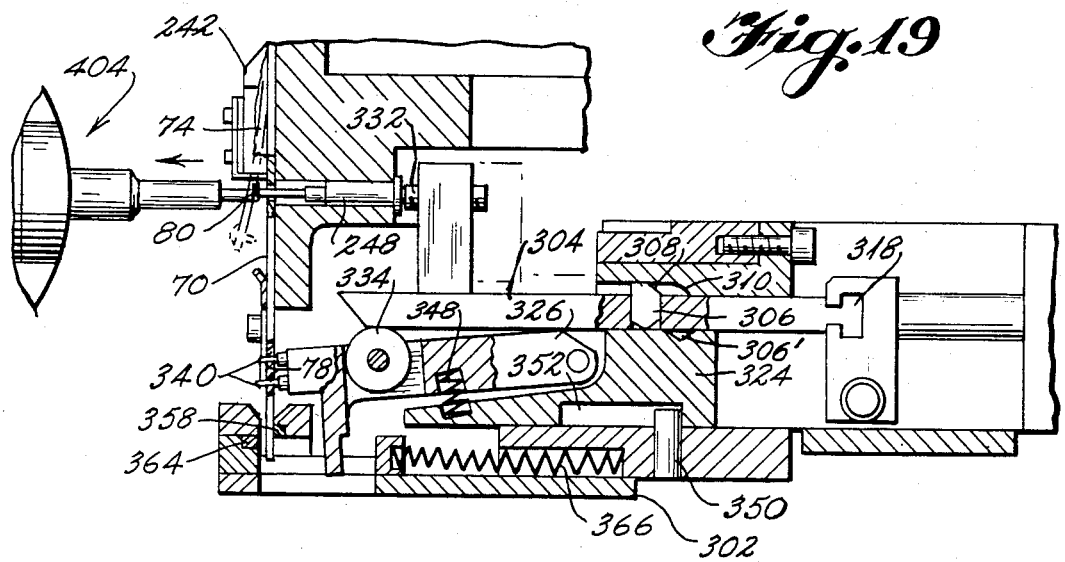
Figure 20:
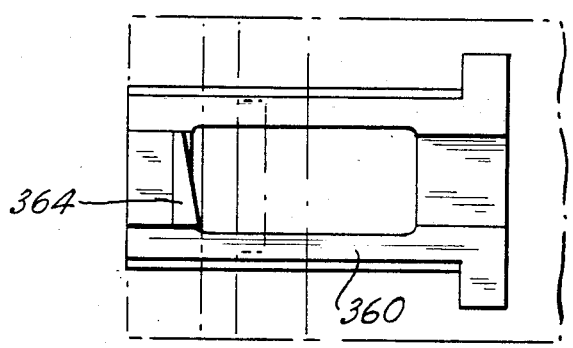
FIG. 20 is an enlarged plan view of the reciprocatable anvil.

Attached to the front of housing 302 is a shear assembly having a fixed anvil 356 with upper shear blade 358 and a reciprocatable anvil 360 with lower shear blade 364. Anvil 360 is biased forward by compression spring 366 so that tape 70 (FIG. 3) can feed downward between horizontally spaced upper and lower shear blades 358, 364 when anvil 360 is in the forward position of FIGS. 18 and 19. One shear blade (as shown in FIG. 20) or both blades may be angled so that less force is required to shear taped substrate 72. Drive pins 340 are located at the front of lever 326 and engage the feed holes 78 of supply tape 70 when block 324 is halted in its forward position. As cam bar 304 continues to move forward, to pivot lever 326, these pins 340 index supply tape 70 downwardly (nominally 5/32") so that a component is properly positioned for pick-up. A portion of the supply tape (between sequential component carrying pockets or apertures 79) is thereby presented to shear blades 358, 364 for cutting. After cutting, a positive air displacement means (not shown) conveys the cut-off portion of the tape 70 to a scrap bin (also not shown). To provide the shearing action, anvil 360 is spring biased toward blade actuating arm 338; during the reverse stroke, arm 338 moves anvil 360 rearwardly against the bias of spring 366 (FIG. 17). Lateral dog 368 is spring biased to engage the top of lever 326 and to hold it down during a portion of the reverse stroke until drive pins 340 clear feed holes 78 and detect 306 rekeys cam bar 304 and lever support block 324. As cam bar 304 moves in the reverse stroke, angled portion 308 of detent 306 engages cam surface 310 to force detent 306 downwardly and to rekey cam bar 304 and lever support block 324. During the remainder of the reverse stroke, lever support block 324 moves rearwardly with cam bar 304. Lever 326 is provided with a chamfer 346 on which the lateral dog 368 rides during rearward movement of lever support block 324 to allow clockwise pivoting of lever 326 back to the position of FIG. 17.

Split clamps 330, 342 are mounted on cam bar 304 and lever support block 324, respectively, and set screws 332, 344 are adjustably threaded into split clamps 330, 342. During part of the forward stroke of piston/cylinder 322, drive pins 340 engage the feed holes 78 of tape 70 and set screw 344 engages spring biased pin 240 of registration segment 228 to disengage lock pin 236 from feed hole 78. Further forward movement of cam bar 304 (when unkeyed from lever support block 324) causes counterclockwise pivoting of lever 326 and the indexing of tape 70. Still further forward movement (approximately ⅛") of cam bar 304 causes set screw 332 to engage spring biased knockout pin 248 and push it into engagement with rear film 76 of tape 70 to assist loading of chip 80 onto vacuum nozzle 404.

TURRET ASSEMBLY 400

Referring to FIG. 21, the general functions performed by Turret Assembly 400 are: pick-up of a chip at a pick-up station; centering and testing at a test station to determine orientation and component quality; ejection of defective or inverted components at an eject station; centering and orienting good components at an orient station for proper placement at selected positions of the P.C. board; and placement of good components at a placement station onto the dots of adhesive which were previously applied to the P.C. board. The turret head 402 is rotatable and comprises four vacuum nozzles 404 for holding components during transfer from one station to the next, although more or less nozzles could be incorporated therein.

At the pick-up station, one of the nozzles 404 receives an individual chip 80. Assisting the transfer of a chip 80 from supply tape 70 to nozzle 404 is a knockout pin 248 of Feed Assembly 300, as already explained.

Figure 23:
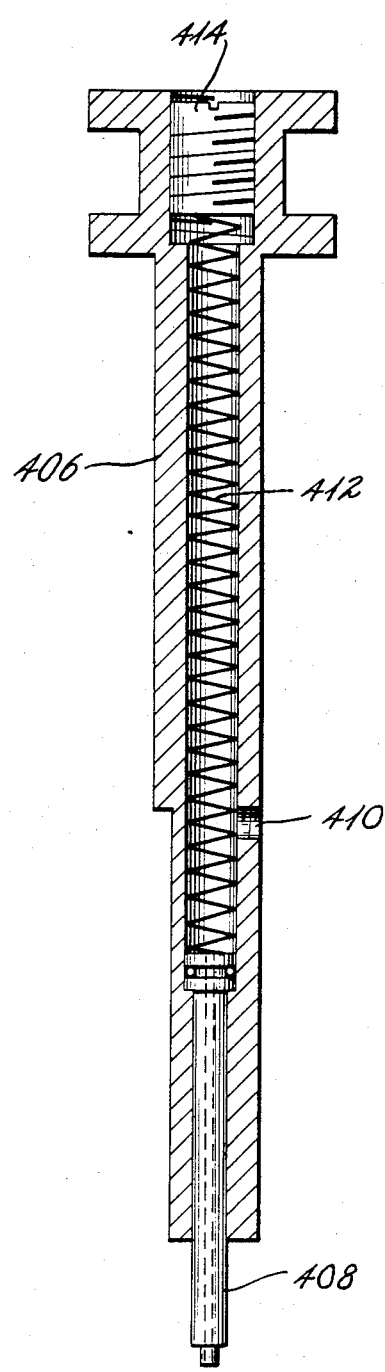
FIG. 23 is an enlarged elevation, partially in section, of the pistons of a vacuum nozzle.

As seen in FIGS. 22 and 23, each nozzle 404 comprises a reciprocating hollow piston 406 for extension and retraction of the nozzle 404. Telescoped within each piston 406 is a smaller hollow piston 408 which is biased outwardly by compression spring 412. Set screw 414 closes the inner (upper) end of piston 406 and provides spring force adjustment so that smaller piston 408 will positively engage a component, yet yield so that no chip breakage occurs. Vacuum is applied by way of orifice 410.

Figure 24:
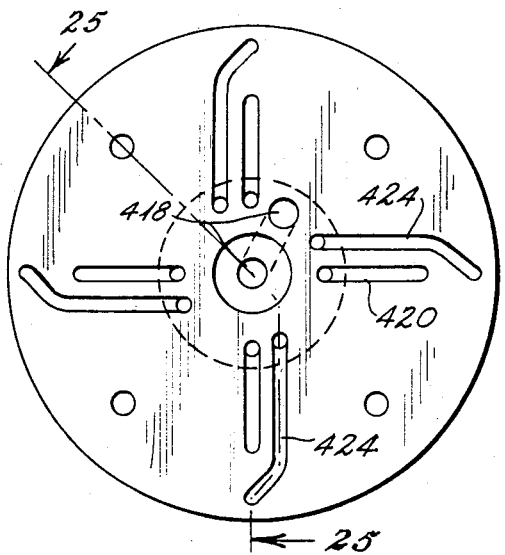
FIG. 24 is a sectional view, taken along arrows 24—24 of FIG. 22.
Figure 25:
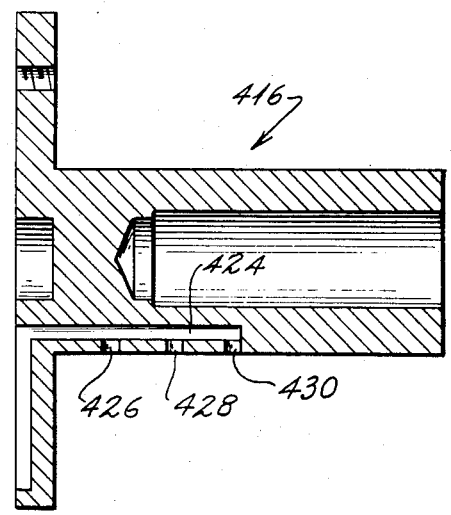
FIG. 25 is a sectional view, taken along arrows 25—25 of FIG. 24.
Figure 26:
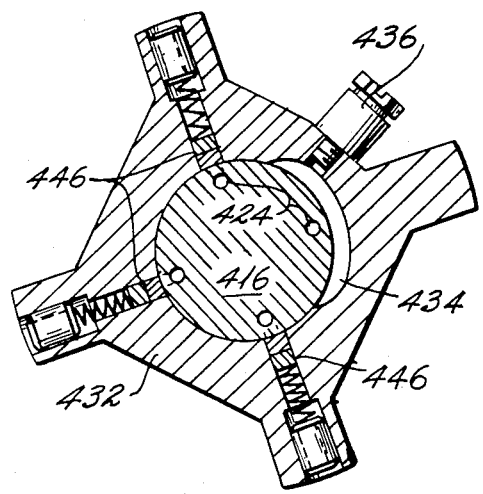
FIGS. 26-29 are sectional views, taken respectively along arrows 26—26, 27—27, 28—28, and 29—29 of FIG. 22.
Figure 27:
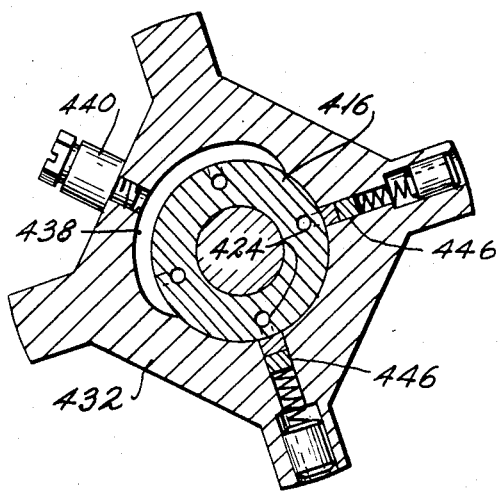
Figure 28:
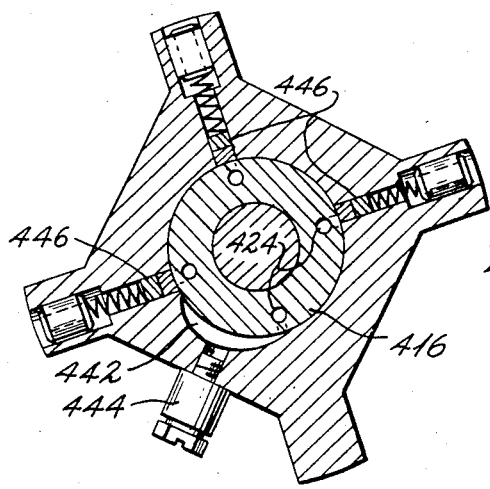

The rotatable hub 416 which carries nozzles 404 is shown in FIGS. 22, 24 and 25. Positive air passage 418 is common to all four nozzles 404 for the extension thereof, with the extension air inlet to passage 418 being located at 419. Spaced around the hub 416 are a series of other positive and negative air passages for each nozzle 404, with the series for one nozzle 404 described as follows: retract positive air is furnished through air passage 420, with the retract air entrance to passage 420 being at 422; vacuum supply passage 424 is intersected by three aligned inlets 426, 428, 430.

Rotatable hub 416 fits into housing 432, as can be seen in the cross-sectional view of FIG. 22. The internal diameter of housing 432 is modified in order that the following functions may be accomplished: all nozzles 404 are extended and retracted by positive air at the pick-up, test, orient, and placement stations; negative air (nominally a vacuum of 15-18 inches of mercury) is always applied to the nozzles 404 and a vacuum differential pressure is sensed on the nozzles at the pick-up and placement stations to determine whether a chip is, in fact, held thereby. A typical vacuum differential sensing arrangement is described in U.S. Pat. No. 4,135,630—Snyder, et al.

To accomplish the above functions, a common vacuum supply is provided for the nozzles and valved (by hub 416 rotating in housing 432) for various quadrants of rotation corresponding to the stations. For instance, the test and orient quadrants have a common vacuum supply, and each of the other quadrants (pick-up and placement) has a separate vacuum supply.

Referring also to FIGS. 26-29, the internal diameter of housing 432 is provided with staggered pockets 434, 438, 442 for respective cooperation with each series of inlets 426, 428, 430 of hub 416, and corresponding vacuum supplies 436, 440, 444 are connected to the pockets.

Figure 29:
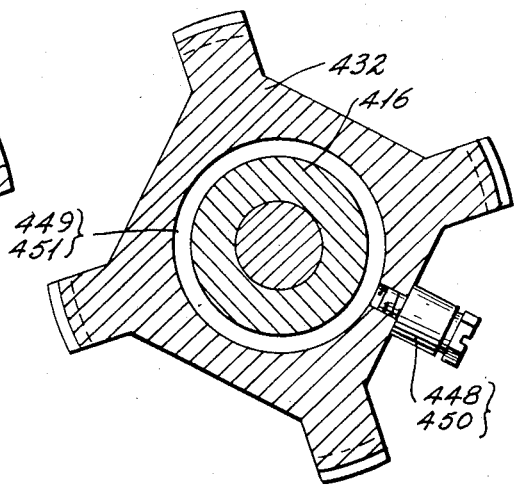

In these sectional views, it can be seen that a nozzle at the pick-up station receives isolated vacuum via supply 436, pocket 434, and the inlet 426 and passage 424 corresponding to that nozzle, while the inlets 426 corresponding to the other nozzles 404 are blocked from the nozzle at the pick-up station by spring biased plugs 446. Plugs 446 are for insuring segregation of vacuum supplies so that vacuum pressure differentials may be sensed on the pick-up nozzle. The nozzles at the test and orient stations receive a common vacuum supply via separate inlet 440, pocket 438, and corresponding inlets 428 and passages 424. Again, plugs 446 insure segregation of vacuum supplies. The nozzle at the placement station receives an isolated vacuum supply via inlet 444, pocket 442, and corresponding inlet 430 and passage 424 so that a vacuum differential may be sensed at the placement station. Still again, plugs 446 are for isolation. The pockets 434, 438, 442 overlap so that a vacuum is always on each nozzle 404 during rotation thereof. FIG. 29 applies to two separate positive air grooves 449, 451 in the internal diameter of housing 432, with both cross-sectional views being identical. Separate air supply connections 448, 450 supply air to grooves 449, 451 respectively according to a valve (not shown) for extension or retraction of nozzles 404.

Figure 30:
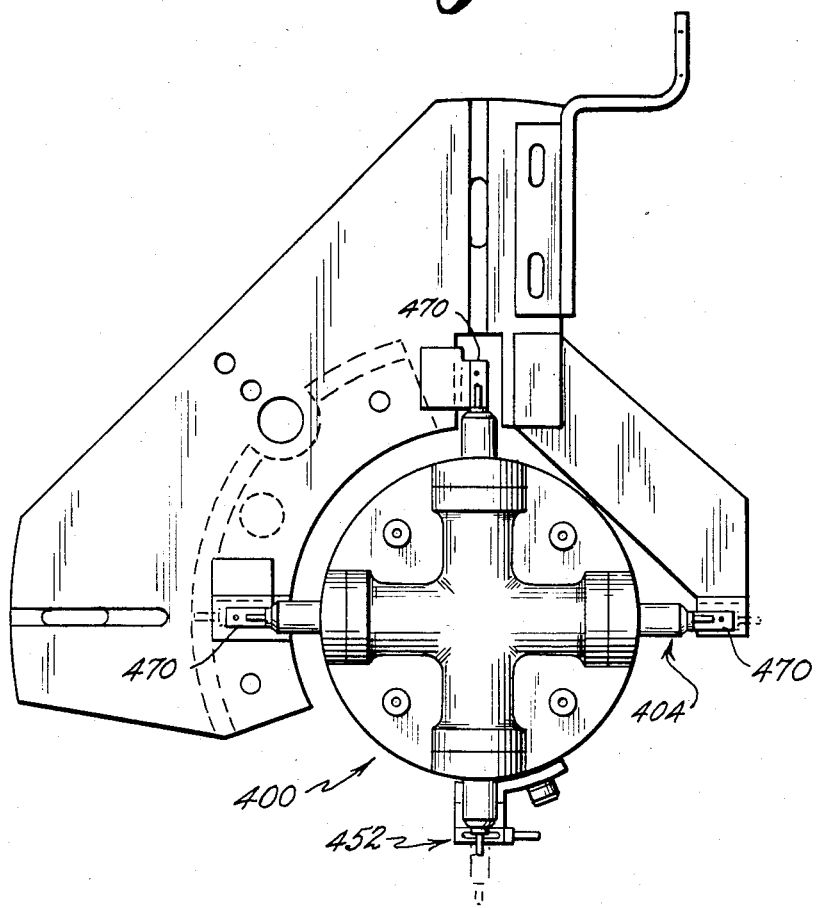
FIG. 30 is a front elevation of the turret assembly.

A flat air cylinder 452 (as seen in FIGS. 22 and 30) is actuated to move flat blocking 454 into position to prevent extension of nozzle 404 when it has been determined that no component is held for placement at the placement station. Blocking rod 454 prevents lowering of the nozzle at the placement station into a glue dot when a component is missing.

Figure 31:
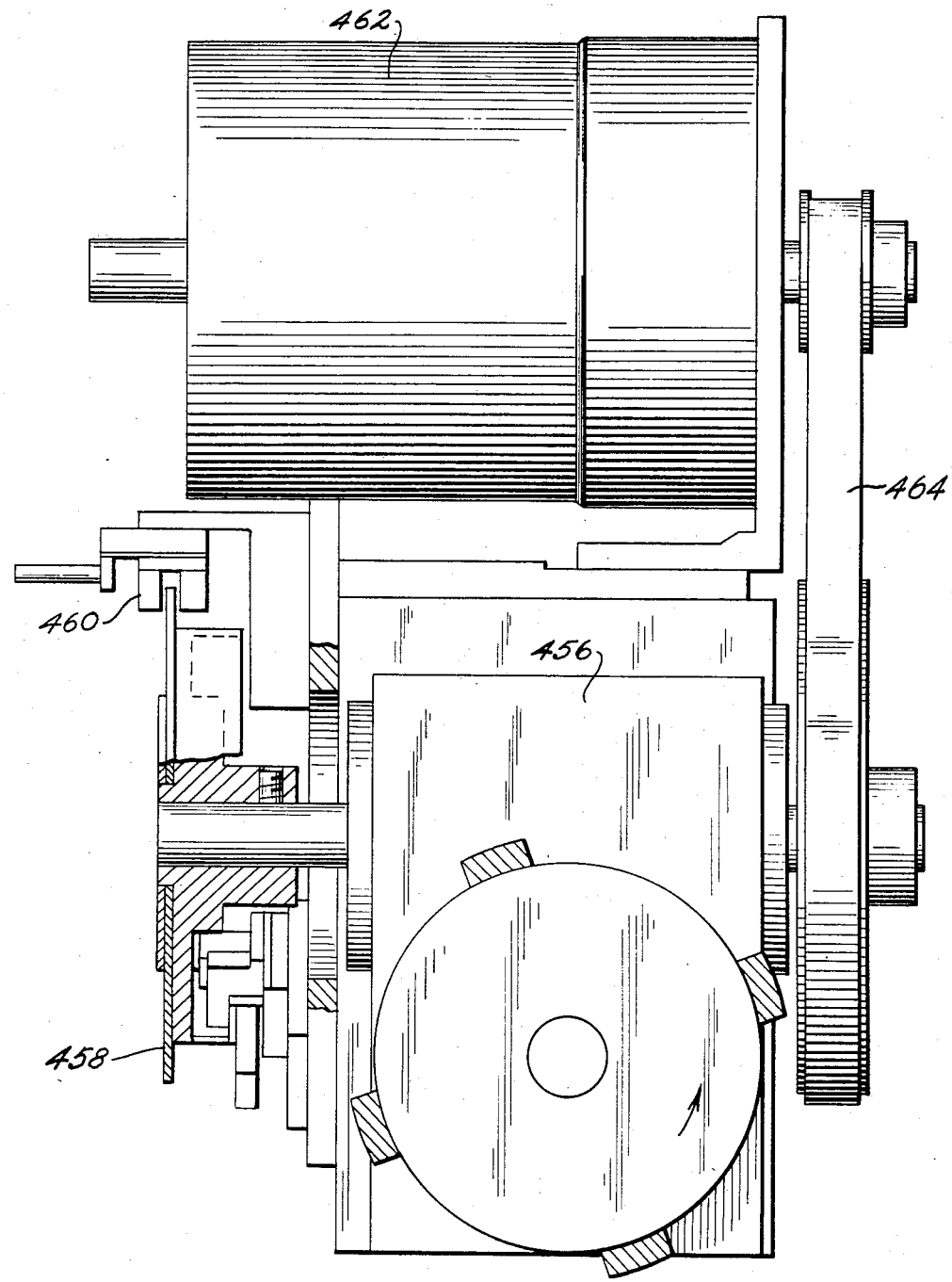
FIG. 31 is a partial front elevation illustrating the drive means for the turret assembly.
Figure 32:
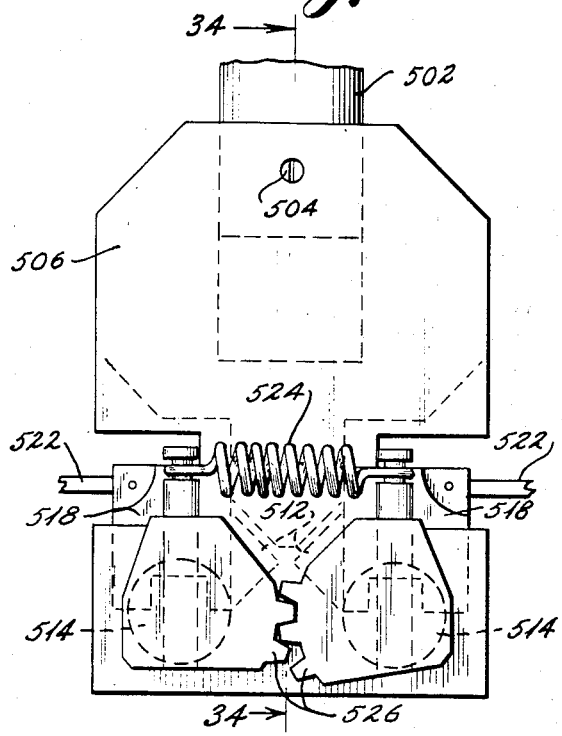
FIG. 32 is a right side elevation of the tester.
Figure 33:
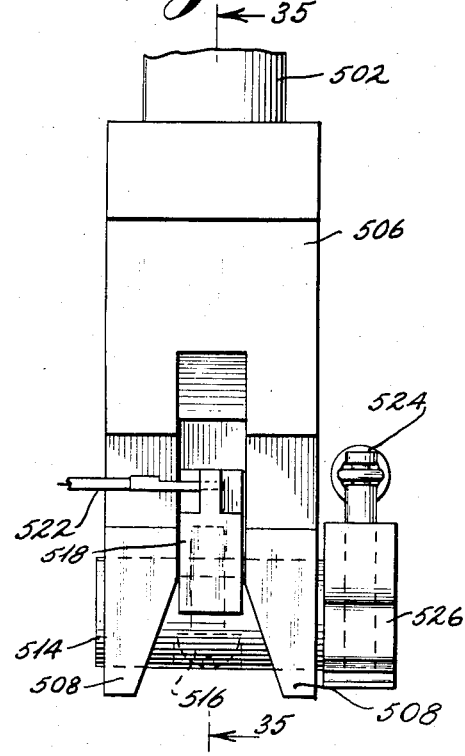
FIG. 33 is a front elevation of the tester.

Gear box 456 drives the rotatable turret head 402. As seen in FIG. 31, a timing disc 458 and Hall effect switch arrangement 460 senses the rotational position of turret head 402 for a controller such as a digital computer, and motive power is supplied to gear box 456 through drive belt 464 and motor 462.

Sensors 470 (FIG. 30) are provided to sense when the nozzles at the pick-up, test, and orient stations are fully retracted, and to relay such information to the controller. By providing sensors 470, the turret head 402 may be rotated as soon as these three nozzles are fully retracted, thus eliminating the need to hold any one nozzle at a station for a predetermined amount of time. Some components take longer to test at the test station. Rather than having to allow the longest amount of time it would take to test any component, the head 402 may be rotated as soon as the three nozzles are retracted (unless no chip 80 is picked-up at the pick-up station, in which case refiring of the nozzles is also programmed into the controller). If any of the three nozzles does not fully retract for some reason, then the machine shuts down and a warning is indicated at control panel 60 (FIG. 1). Sensors 470 are preferably subminiature LED reflective skanners, model S 13224, by SKAN-A-MATIC Corporation.

TESTER 500

Upon receiving a chip 80 at the pick-up station, turret head 402 is rotated to position the vacuum nozzle-held chip beneath the test station. At this station, the nozzle 404 is extended for centering of the component 80 thereon and for verification that the sequenced component 80 is within a specified tolerance of its stated electrical value and is correctly oriented.

Figure 34:
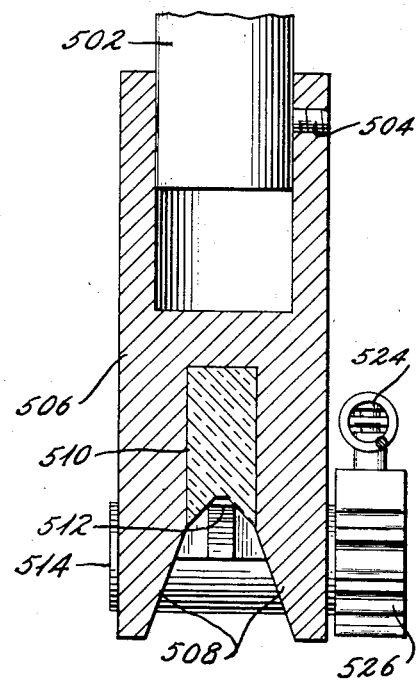
FIG. 34 is a sectional view along arrows 34—34 of FIG. 32.

Tester 500 (FIGS. 32-35) comprises vertical support post 502 to which tester body 506 is attached by set screw 504. Body 506 has integral fixed locater arms 508 which are inwardly and upwardly inclined as seen in FIG. 34. Ceramic insulating block 510 is attached to body 506 and forms part of fixed locater arms 508. Assuming the longitudinal axis of the nozzle 404 to be the "Z" axis of a cartesian coordinate system, fixed locater arms 508 engage and center chip 80 along another axis (such as the "X" axis) during extension of nozzle 404. Additionally, pivotal locater arms 512 center the chip 80 relative to nozzle 404 along the third ("Y") axis. Pivotal locater arms 512 are integral with metal blocks 518, with all but surface 520 of the outer surfaces of arms 512 and blocks 518 being coated with an insulating material. Electrical test leads 522 are conductively attached to blocks 518. To provide pivotal motion to locater arms 512, blocks 518 are attached by screws 516 to rods 514 which are pivotally attached to body 506. Mating gear segments 526 are provided on one end of each rod 514 so that pivotal locater arms 512 rotate the same amount, with spring 524 normally biasing the arms 512 to the position of FIG. 35. Through electrical leads 522, parametric testing of components is accomplished through the use of an asymmetrically-driven AC bridge circuit, as in U.S. Pat. No. 4,050,017—Paufve. In this bridge circuit, the test component is balanced against a decade resistance reference, using a reference voltage and a voltage scaled to the significant digits of the component value. Any bridge imbalance is amplified and fed back to the scaled bridge drive such that the output is proportional to the component error percentage. The determined error percentage is compared with programmed tolerance limit levels; a within-tolerance measurement will allow the system to advance the next test and continue automatic processing; an out-of-tolerance measurement will indicate a faulty or misoriented component. Diode voltage and leakage current tests make use of internally generated DC voltages applied to a modified bridge circuit utilizing the above philosophy for tolerance testing.

Figure 35:
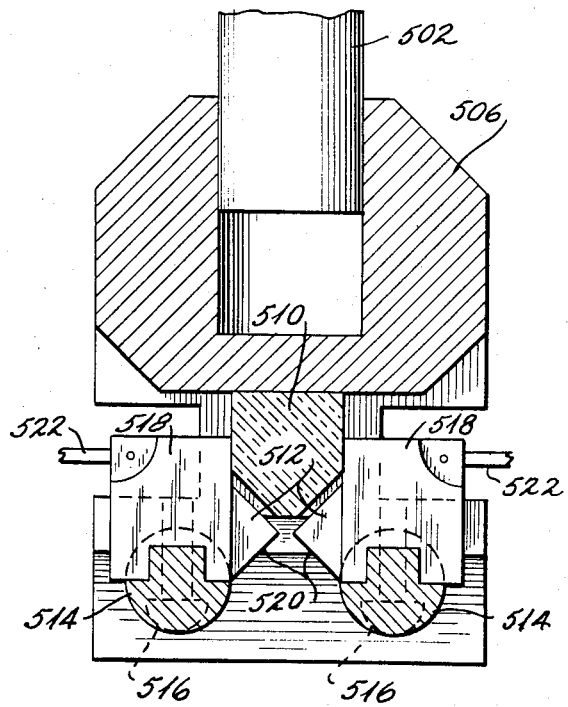
FIG. 35 is a sectional view along arrows 35—35 of FIG. 33.

After a nozzle 404 is moved from the pick-up station to the test station (FIG. 21), it is extended along its longitudinal axis to engage a chip 80 with tester 500. If chip 80 is slightly angularly misoriented about this longitudinal or Z-axis (i.e., less than 45° misoriented relative to an axis orthoganol to the Z-axis), then during the extension of nozzle 404 the long dimension edges of front surface of chip 80 (as viewed in FIG. 3) engage the angles surfaces of locater arms 508 and the short dimension edges of front surface of chip 80 engage the angled surfaces of locater arms 512 (FIG. 35). These engagements of the edges of chip 80 with the angled surfaces of locater arms 508 and 512 will center chip 80 upon the Z-axis of nozzle 404 while also orienting the chip about the Z-axis so that the long and short dimensions of the front surface of chip 80, respectively, are aligned with axes (such as X and Y) which are orthoganol with the Z-axis. As can be seen from FIGS. 32-35, the above-described orientation requires that locater arms 508 and 512 are oriented such that the longitudinal axis of shaft 502 coincides with the longitudinal axis of nozzle 404 at the test station and that the length and width dimension of tester 500 (as viewed along shaft 502), respectively, are aligned with axes X and Y.

Referring to FIG. 3, so-called "leadless chips" 80 have electrically conductive portions 80' in order to connect the chips electrically into the circuits of circuit boards. It is these conductive portions 80' which must be connected to tester circuitry (not shown), via leads 522 of tester 500, in order to test the electrical characteristics of chip 80. Accordingly, portions 80' of chip 80 contact angled conductive surfaces of pivotal locator arms 512 (to which leads 522 are connected) during testing.

After testing (approximately 24 msec per chip, on average), nozzle 404 is retracted for transport of chip 80 to the orient station.

EJECTER 600

During rotation of turret head 402 from the test station to the orient station, the retracted nozzle 404 and vacuum-held chip 80 pass through gap 602 of ejecter 600 (FIG. 36). If the component was found to be faulty or inverted at the test station, a positive air blast is applied at 604 under command of the controller. With angled bore 606 located below the component which is passing through gap 602, air pressure blows the faulty component off of nozzle 404 and carries it through orifice 608 which is connected by a tube to a collection bin (not shown). If the chip is misoriented about the "Z" axis of the nozzle 404 by 90° or 180°, or if the chip is not faulty, no air blast occurs and the chip is transported to the orient station.

ORIENTER 700

At the orient station, nozzle 404 is again extended for centering of the component. The centering mechanism of orienter 700 (FIG. 37) is like that of tester 500, except that the ceramic insert, and electrical leads are omitted. A motor 702, such as a stepping motor, rotates the centering mechanism 90° or 180° or in increments of 15° about the "Z" axis of the nozzle, as required for proper positioning of the component prior to placement on the P.C. board and as programmed into the controller. Hall effect switch 704 senses the rotational position of orienter 700 for the controller.

GENERAL OPERATION OF THE PREFERRED EMBODIMENT

P.C. boards are located on X-Y positioner 40, by which they are properly positioned for application of adhesive dots at selected positions thereon by Adhesive Assembly 100. After adhesive has been applied, the P.C. boards are transferred to a position under the Turret Assembly 400 and another set of boards is located under Adhesive Assembly 100. With like P.C. boards located under Turret Assembly 400 and Adhesive Assembly 100, X-Y positioner 40 positions these P.C. boards so that an adhesive dot is applied to the same selected position on one P.C. board as that of the other P.C. board which is having a component 80 applied onto an already applied dot. Sensors 50 (FIG. 1) sense a defective P.C. board so that no adhesive is applied and no component is supplied and placed onto that board. In P.C. board population, there are often groups of P.C. boards (such as four) connected together during the population, and separated afterward. By using sensors 50, only selected defective P.C. boards of a group will not be populated. The sensors 50 are the light reflective fiber optic type, such as Model No. 310 manufactured by DOLAN-JENNER Industries, Inc., and are adapted to sense a reflective marker which is placed on defective P.C. boards in a prior inspection process.

A component 80 is supplied to the pick-up station by rotation of carousel 20 so that the proper supply reel 210 is located above the pick-up station. Then, Feed Assembly 300 advances the tape 70 downward to present a component 80 for pick-up. Input reels 210 are arranged on carousel 200 in two tiers 204, 206 of thirty-two reels each. Access to the reels is program preselected, with alternate supply reel programming permitted. The structural arrangement provided by the invention allows a reel to be changed and the machine to be put back into operation within 20-30 seconds after end-of-tape sensor 250 indicates that a reel 210 is empty. The bottom end of each tape 70, after feeding past the pick-up station, is chopped off and evacuated to a scrap collection bin.

In concert with the other portions of the machine and according to a controller (such as a digital computer) Turret Assembly 400 is rotationally indexed through four different positions (as seen in FIG. 21) for pick-up, testing, orienting, and placement of a component and nozzles 404 are extended and retracted at each of these positions. Additionally, an ejection station is provided between the testing and orienting stations for positive air ejection of defective or inverted components while the turrent head is moving. Turret Assembly 400 has four vacuum nozzles 404 located at 90° intervals about the axis of rotation. As the head rotates through 90° increments, the following chip handling steps occur:

Step One—Pick-Up. A chip 80 is removed from the programmed input tape magazine 200. Pick-up is by a vacuum nozzle 404. The nozzle vacuum is monitored to assure that a chip 80 is actually extracted from the tape 70. If no chip 80 is sensed on the nozzle 404, two additional attempts to extract a chip will be made (during indexing of the tape 70 twice more by the feeder 300). If a chip is still not sensed on the nozzle, the magazine 200 may be advanced to an alternate input reel 210 or, if no alternate is programmed, processing is stopped to permit operator action.

Step Two—Testing. The chip enters the Test Station jaws. It is centered on the vacuum nozzle where contact fingers 512 complete the test circuit path with the chip and it is tested for quality and orientation.

Step Three—Eject. If a chip fails any verification test programmed at Step Two, it is ejected from the vacuum nozzle. Ejection is performed by an air blast that transports the test failed chip to a collection bin. A "Repair" function permits ejected chips to be replaced on the printed circuit card after the initial sequence is completed.

Step Four—Orient. Orientation for placement is accomplished by rotating the chip about the longitudinal axis of the nozzle. The orienter 700 may orient the chip in 15° increments about the centerline axis of the vacuum nozzle. 90° and 180° rotation is also programmable to allow the chip to be oriented along its centerline in either the X or Y axis.

Step Five—Placement. The chip is positioned on the printed circuit board at its programmed location and is held in place by the adhesive dot placed on the board during the previous adhesive application process.

If a chip is not in place on the nozzle when it arrives at the Placement Station, the downward travel of the nozzle at the chip placement station is inhibited by firing of cylinder 452. The replacement chip may then be positioned on the circuit board following the REPAIR function procedure.

Preferably, a non-lubricated air supply is used for: scrap tape evacuation from cutter 350, 360; component ejection at the eject station; end-of-tape sensor 250; and pressurizing the glue supply reservoir.

During pick-up, the extended nozzle 404 stops a short distance from tape 70 (nominally 0.005" from the substrate). If a component has been ejected from a nozzle 404 by ejector 600, then a special buffer of the controller acts as a back-up to the placement station vacuum differential sensing to assure firing of flat cylinder 452 so that blocker plate 454 prevents that nozzle from engaging an adhesive dot on the P.C. board.

It will thus be seen that the objects made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An apparatus for indexed feeding of a component supply tape having feed holes spaced along the length thereof to position a component of said supply tape for pick-up at a pick-up station, and comprising:

a housing;

a cam bar reciprocatable within said housing, said cam bar having a key displaceable therein, and a cam surface;

a drive means for reciprocating said cam bar in a forward and reverse stroke, upon command;

a support block having a key hole for engagement by said key to provide keying of said block to said cam bar during a portion of said forward and reverse stroke such that said block is reciprocated;

an upwardly biased lever pivotally supported on said support block and having drive pins for engaging said feed holes and indexing said tape during a portion of said forward stroke;

stop means for limiting the forward movement of said block during said forward stroke;

roller means attached to said lever and engageable by said cam surface during said forward stroke to cause downward pivoting of said lever for indexing of said tape;

dog means for holding said lever in the downward pivoted position during disengagement of said drive pins on said reverse stroke; and sensor means for sensing said forward and reverse stroke.

2. An apparatus as in claim 1, and further comprising:

cutter means for cutting said tape during said reverse stroke, said cutter means actuated by said lever.

* * * * *